(12) United States Patent
Yin et al.

(10) Patent No.: US 11,545,411 B2
(45) Date of Patent: Jan. 3, 2023

(54) PACKAGE COMPRISING WIRE BONDS CONFIGURED AS A HEAT SPREADER

(71) Applicant: QUALCOMM Incorporated, San Diego, CA (US)

(72) Inventors: Wen Yin, Chandler, AZ (US); Yonghao An, San Diego, CA (US); Reynante Tamunan Alvarado, Escondido, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 30 days.

(21) Appl. No.: 16/941,487

(22) Filed: Jul. 28, 2020

(65) Prior Publication Data
US 2022/0037224 A1    Feb. 3, 2022

(51) Int. Cl.
*H01L 23/367* (2006.01)
*H01L 21/56* (2006.01)
*H01L 23/552* (2006.01)
*H01L 23/00* (2006.01)

(52) U.S. Cl.
CPC .......... *H01L 23/3677* (2013.01); *H01L 21/56* (2013.01); *H01L 23/552* (2013.01); *H01L 24/32* (2013.01); *H01L 24/43* (2013.01); *H01L 24/48* (2013.01); *H01L 24/49* (2013.01); *H01L 24/73* (2013.01); *H01L 24/92* (2013.01); *H01L 2224/32225* (2013.01); *H01L 2224/43847* (2013.01); *H01L 2224/48227* (2013.01); *H01L 2224/4912* (2013.01); *H01L 2224/49051* (2013.01); *H01L 2224/73265* (2013.01); *H01L 2224/92247* (2013.01)

(58) Field of Classification Search
CPC .......................... H01L 23/552; H01L 23/3677
See application file for complete search history.

(56) References Cited

U.S. PATENT DOCUMENTS

| | | | |
|---|---|---|---|
| 2006/0126308 A1* | 6/2006 | Campbell | H01L 23/473 361/719 |
| 2007/0023880 A1* | 2/2007 | Hess | H01L 23/3677 257/E23.101 |
| 2008/0032446 A1 | 2/2008 | Wood et al. | |
| 2014/0307394 A1 | 10/2014 | Lobianco et al. | |
| 2021/0280552 A1* | 9/2021 | Tsai | H01L 24/45 |

OTHER PUBLICATIONS

International Search Report and Written Opinion—PCT/US2021/037000—ISA/EPO—dated Dec. 14, 2021.

* cited by examiner

*Primary Examiner* — Yu-Hsi D Sun
(74) *Attorney, Agent, or Firm* — Loza & Loza, LLP

(57) ABSTRACT

A package that includes a substrate, an integrated device, a plurality of first wire bonds, at least one second wire bond, and an encapsulation layer. The integrated device is coupled to the substrate. The plurality of first wire bonds is coupled to the integrated device and the substrate. The plurality of first wire bonds is configured to provide at least one electrical path between the integrated device and the substrate. The at least one second wire bond is coupled to the integrated device. The at least one second wire bond is configured to be free of an electrical connection with a circuit of the integrated device. The encapsulation layer is located over the substrate and the integrated device. The encapsulation layer encapsulates the integrated device, the plurality of first wire bonds and the at least one second wire bond.

30 Claims, 15 Drawing Sheets

PROFILE VIEW

PROFILE VIEW

PROFILE VIEW

PLAN VIEW

PROFILE VIEW

PROFILE VIEW

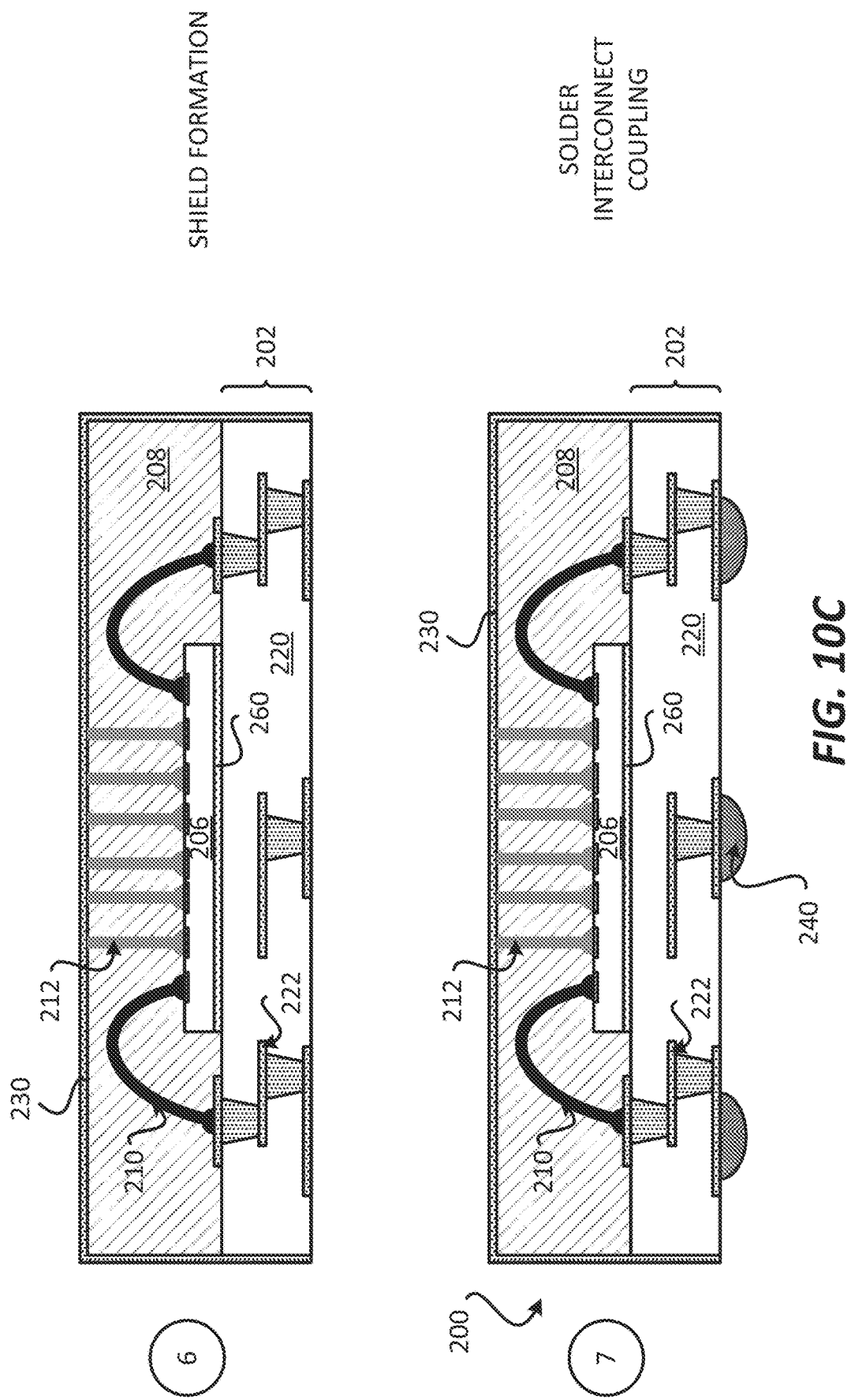

PACKAGE COMPRISING WIRE BONDS CONFIGURED AS A HEAT SPREADER

FIELD

Various features relate to packages that include an integrated device, but more specifically to a package that includes an integrated device, a substrate, and wire bonds configured as a heat spreader.

BACKGROUND

FIG. 1 illustrates a package 100 that includes a substrate 102, an integrated device 104, and an encapsulation layer 108. The substrate 102 includes at least one dielectric layer 120, a plurality of interconnects 122, and a plurality of solder interconnects 124. A plurality of solder interconnects 144 is coupled to the substrate 102 and the integrated device 104. The integrated device 104 may be a flip chip. The encapsulation layer 108 encapsulates the integrated device 104 and the plurality of solder interconnects 144. Encapsulating the integrated device 104 with the encapsulation layer 108 can restrict and slow down the heat that dissipates from the integrated device 104, which can cause the integrated device 104 to overheat. There is an ongoing need to provide efficient heat dissipation for integrated devices.

SUMMARY

Various features relate to packages that include an integrated device, but more specifically to a package that includes an integrated device, a substrate, and wire bonds configured as a heat spreader.

One example provides a package that includes a substrate, an integrated device, a plurality of first wire bonds, at least one second wire bond, and an encapsulation layer. The integrated device is coupled to the substrate. The plurality of first wire bonds is coupled to the integrated device and the substrate. The plurality of first wire bonds is configured to provide at least one electrical path between the integrated device and the substrate. The at least one second wire bond is coupled to the integrated device. The at least one second wire bond is configured to be free of an electrical connection with a circuit of the integrated device. The encapsulation layer is located over the substrate and the integrated device. The encapsulation layer encapsulates the integrated device, the plurality of first wire bonds and the at least one second wire bond.

Another example provides a device that includes a package. The package includes a substrate, an integrated device, a plurality of first wire bonds, at least one second wire bond, and an encapsulation layer. The integrated device is coupled to the substrate. The plurality of first wire bonds is coupled to the integrated device and the substrate. The plurality of first wire bonds is configured to provide at least one electrical path between the integrated device and the substrate. The at least one second wire bond is coupled to the integrated device. The at least one second wire bond is configured to be free of an electrical connection with a circuit of the integrated device. The encapsulation layer is located over the substrate and the integrated device. The encapsulation layer encapsulates the integrated device, the plurality of first wire bonds and the at least one second wire bond.

Another example provides an apparatus that includes a substrate, an integrated device, means for wire interconnection, means for wire heat dissipation and means for encapsulation. The integrated device is coupled to the substrate. The means for wire interconnection is coupled to the integrated device and the substrate. The means for wire interconnection is configured to provide at least one electrical path between the integrated device and the substrate. The means for wire heat dissipation is coupled to the integrated device. The means for wire heat dissipation is configured to be free of an electrical connection with a circuit of the integrated device. The means for encapsulation is located over the substrate and the integrated device. The means for encapsulation encapsulates the integrated device, the means for wire interconnection and the means for wire heat dissipation.

Another example provides a method for fabricating package. The method provides a substrate. The method couples an integrated device to the substrate. The method couples a plurality of first wire bonds to the integrated device and the substrate. The plurality of first wire bonds is configured to provide at least one electrical path between the integrated device and the substrate. The method couples at least one second wire bond to the integrated device. The at least one second wire bond is configured to be free of an electrical connection with a circuit of the integrated device. The method forms an encapsulation layer over the substrate and the integrated device. The encapsulation layer encapsulates the integrated device, the plurality of first wire bonds and the at least one second wire bond.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 10A-10C illustrate an exemplary sequence for fabricating a package that includes a substrate, an integrated device and wire bonds configured as a heat spreader.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, an integrated device, a plurality of first wire bonds, at least one second wire bond, and an encapsulation layer. The integrated device is coupled to the substrate. The plurality of first wire bonds is coupled to the integrated device and the substrate. The plurality of first wire bonds is configured to provide at least one electrical path between the integrated device and the substrate. The at least one second wire bond is coupled to the integrated device. The at least one second wire bond is configured to be free of an electrical connection with a circuit of the integrated device. The encapsulation layer is located over the substrate and the integrated device. The encapsulation layer encapsulates the integrated device, the plurality of first wire bonds and the at least one second wire bond. The at least one second wire bond is configured to dissipate heat from the integrated device. The package may further include a metal layer formed over an outer surface of the encapsulation layer, where the metal layer is configured as an electromagnetic interference (EMI) shield. The at least one second wire bond is coupled to the metal layer. The package provides a package that can efficiently and effectively dissipate heat away from the integrated device. The wire bonds are much closer to the heat source (e.g., integrated device), thus the wire bonds may provide better and improved heat dissipation from the integrated device. Additionally, using wire bonds adds minimal fabrication costs, since wire bonds are already being formed over the integrated device to provide electrical connections for the integrated device.

Figure 1:
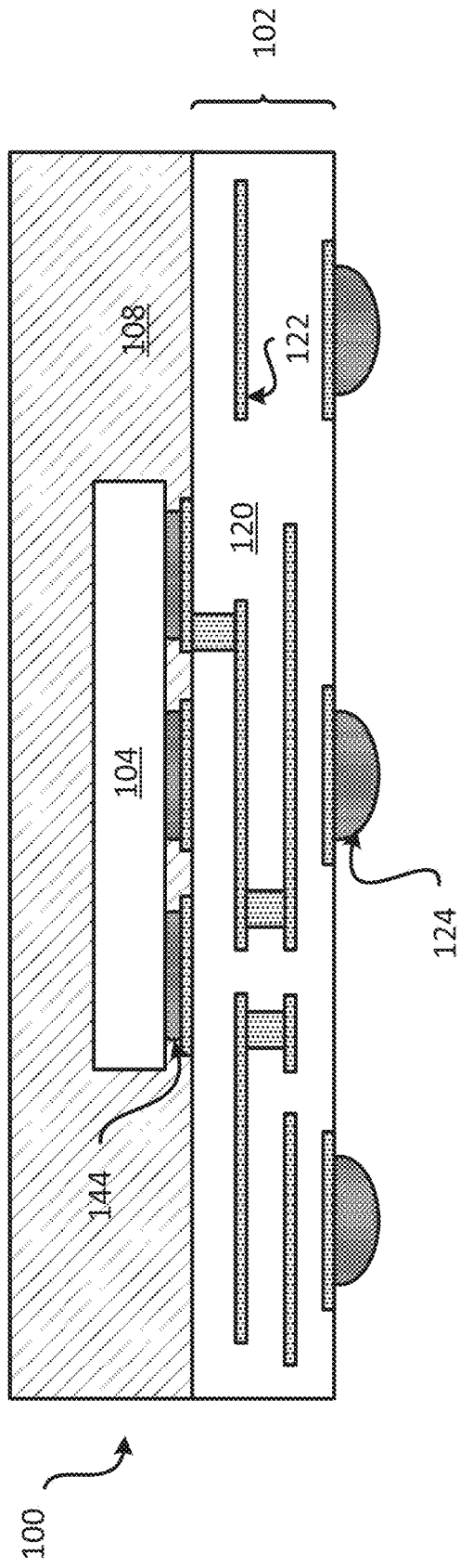
FIG. 1 illustrates a profile view of a package that includes an integrated device and a substrate.
Figure 2:
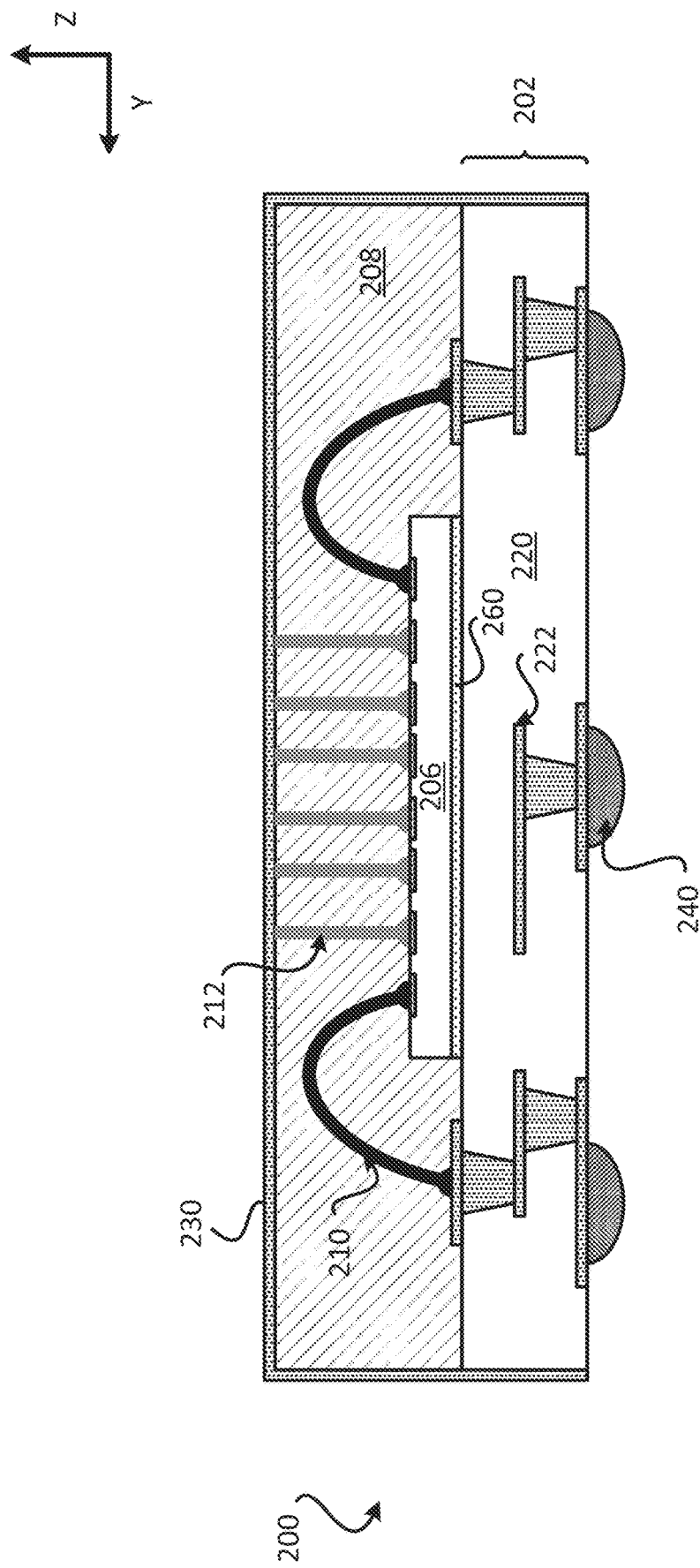
FIG. 2 illustrates a profile view of a package that includes a substrate, an integrated device and wire bonds configured as a heat spreader.

Exemplary Package Comprising a Substrate, an Integrated Device and a Wire Bond Configured as a Heat Spreader FIG. 2 illustrates a profile view of a package 200 that includes wire bonds as a heat spreader. Through the use of wire bonds, the package 200 provides a package with an efficient and effective structure for heat dissipation from an integrated device. The package 200 may provide a cost-effective solution of providing heat dissipation from an integrated device. As shown in FIG. 2, the package 200 includes a substrate 202, an integrated device 206, a plurality of first wire bonds 210, at least one second wire bond 212, an encapsulation layer 208, and a metal layer 230.

The substrate 202 includes at least one dielectric layer 220 and a plurality of interconnects 222. Different implementations may provide different types of substrates. The substrate 202 may be a coreless substrate (e.g., embedded trace substrate), a laminate substrate, or a substrate that includes a core layer. The at least one dielectric layer 220 may include different materials, such as prepreg layer, a polyimide (e.g., photo-etchable dielectric layer), an organic layer, and/or a ceramic.

The integrated device 206 is coupled to the substrate 202. The integrated device 206 may include a semiconductor bare die. The integrated device 206 may include a front side and a back side (e.g., bare die may include a front side and a back side). The back side of the integrated device 206 may be coupled to a first surface (e.g., top surface) of the substrate 202 through an attach 260 (e.g., die attach). The plurality of first wire bonds 210 is coupled to the integrated device 206 and the substrate 202. The plurality of first wire bonds 210 is configured to provide at least one electrical path between the integrated device 206 and the substrate 202. The plurality of first wire bonds 210 may be a means for wire interconnection. Examples of how the plurality of first wire bonds 210 is coupled to the integrated device 206 and the substrate 202 are further illustrated and described below in at least FIGS. 3-4.

The at least one second wire bond 212 is coupled to the integrated device 206. The at least one second wire bond 212 may be a means for wire heat dissipation. The at least one second wire bond 212 is configured to be free of an electrical connection with a circuit of the integrated device 206. A circuit of the integrated device 206 may include active devices. An active device may include at least one transistor. Examples of how the at least one second wire bond 212 is coupled to the integrated device 206 are further illustrated and described below in at least FIGS. 3-4. The plurality of first wire bond 210 and the at least one second wire bond 212 may be made of similar material or the same material.

The encapsulation layer 208 is formed and located over the substrate 202 and the integrated device 206. The encapsulation layer 208 may be coupled to a first surface (e.g., top surface) of the substrate 202. The encapsulation layer 208 may encapsulate the integrated device 206, the plurality of first wire bonds 210 and the at least one second wire bond 212. The encapsulation layer 208 may include a mold, a resin and/or an epoxy. The encapsulation layer 208 may be a means for encapsulation. The at least one second wire bond 212 is configured to dissipate heat from the integrated device 206. The at least one second wire bond 212 may be configured to dissipate heat from an integrated device 206 by providing a thermally conductive path for heat to dissipate from the integrated device and towards a top surface of the encapsulation layer 208. The at least one second wire bond 212 may travel away from the integrated device 206 (e.g., travel vertically relative to a surface of the integrated device 206). However, as will be described below, the at least one second wire bond 212 may travel in different directions and/or paths.

The metal layer 230 is formed and located over an outer surface of the encapsulation layer 208 and/or a side surface of the substrate 202. The metal layer 230 may be coupled to the outer surface of the encapsulation layer 208 and/or the side surface of the substrate 202. The metal layer 230 may be configured as an electromagnetic interference (EMI) shield. The metal layer 230 may include several metal layers. The at least one second wire bond 212 is coupled to the metal layer 230. In some implementations, the at least one second wire bond 212 and/or the metal layer 230 may be configured to be coupled to ground. The metal layer 230 may help with heat dissipation. The metal layer 230 may be a conformal metal layer. The metal layer 230 may be an outer metal layer.

A plurality of solder interconnects 240 is coupled to the second surface (e.g., bottom surface) of the substrate 202. The plurality of solder interconnects 240 may be coupled to the plurality of interconnects 222 through a reflow process.

Figure 3:
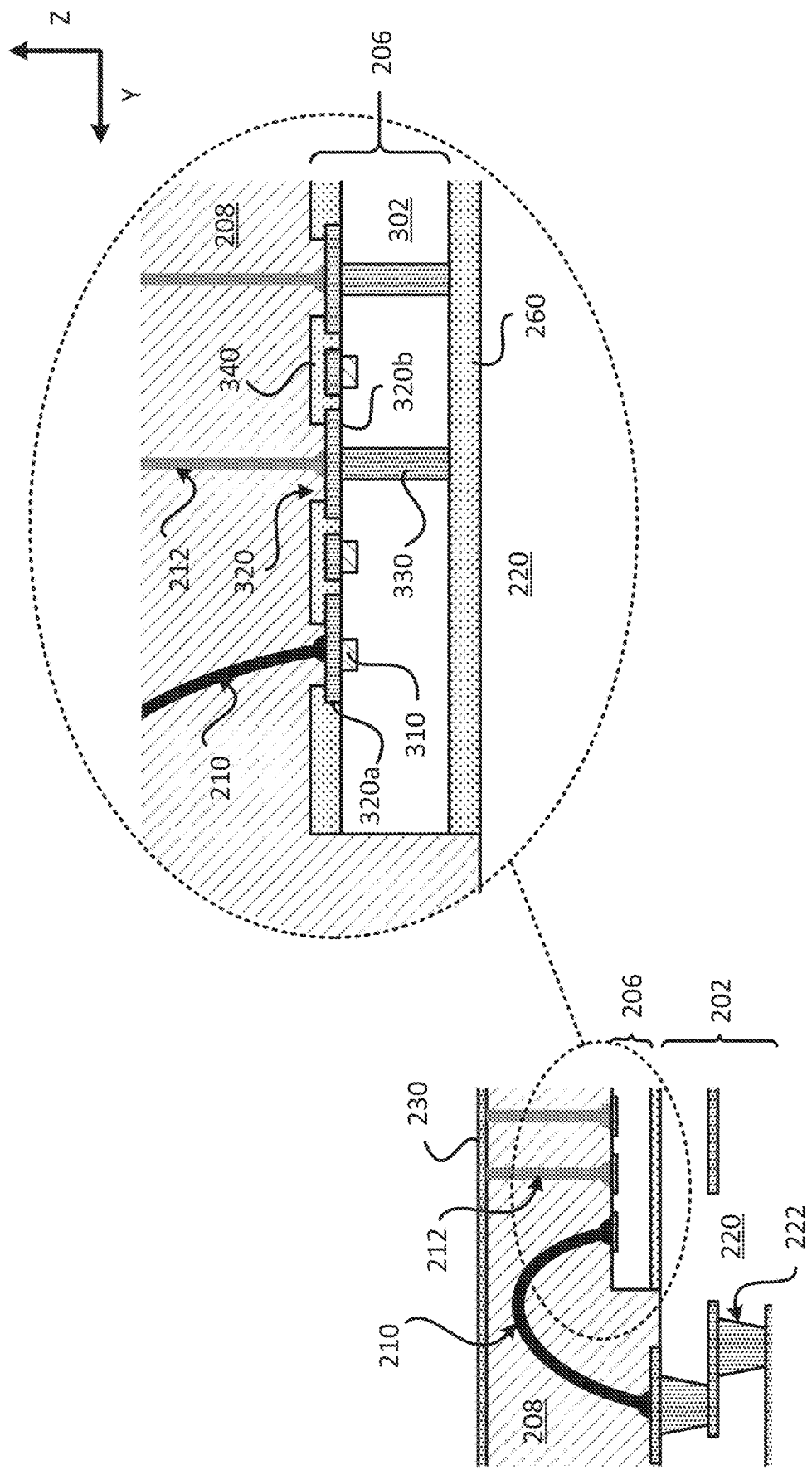
FIG. 3 illustrates a close-up profile view of a package that includes a substrate, an integrated device and wire bonds configured as a heat spreader.
Figure 4:
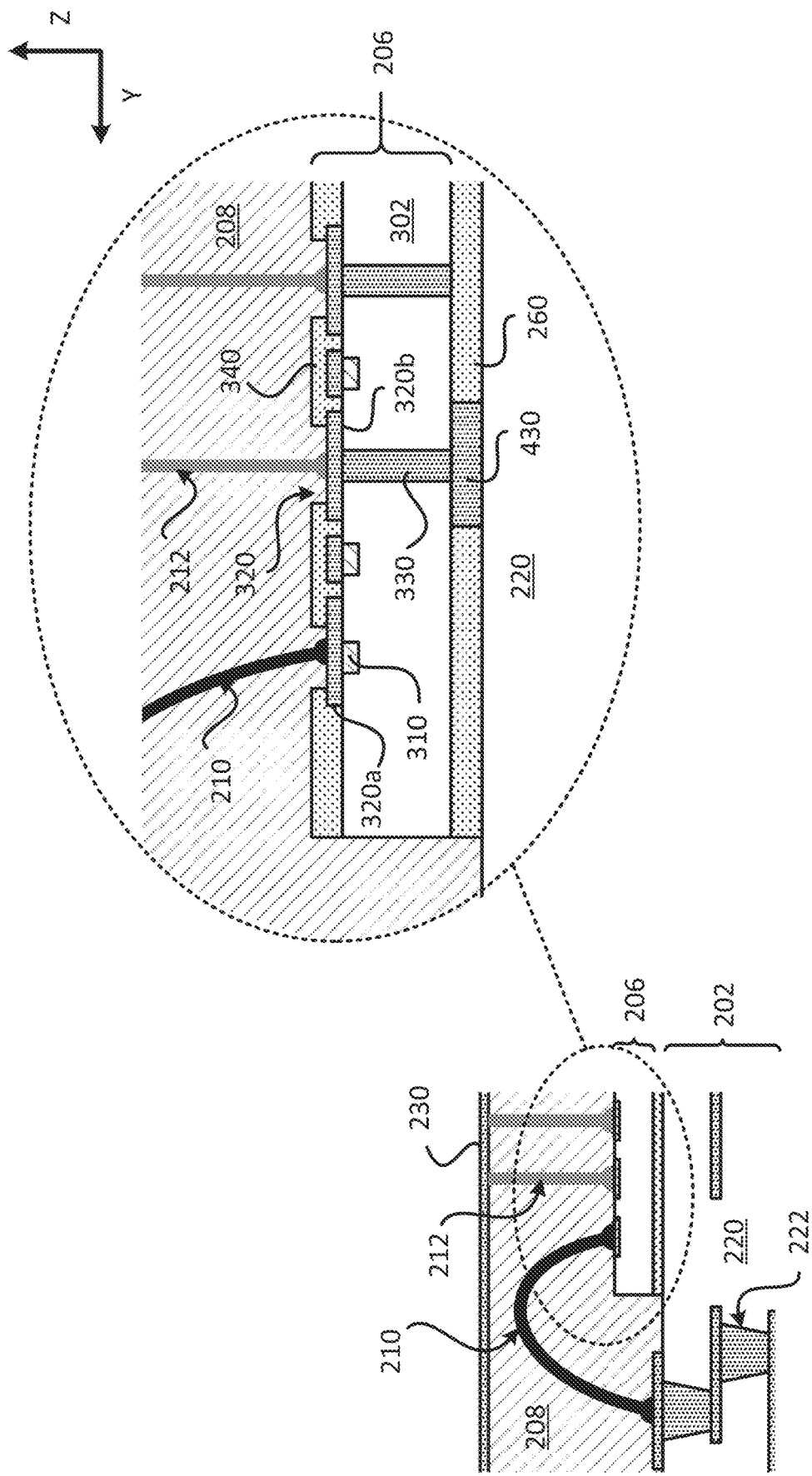
FIG. 4 illustrates a close-up profile view of a package that includes a substrate, an integrated device and wire bonds configured as a heat spreader.

FIGS. 3 and 4 illustrate close up views of how wire bonds may be coupled to an integrated device and a substrate. FIG. 3 illustrates an integrated device 206 that includes a die substrate 302, a plurality of active devices 310 located over the die substrate 302, and a plurality of die interconnects 320 (e.g., 320a, 320b), at least one die substrate via 330 and a passivation layer 340. The integrated device 206 includes a front side and a back side. The front side of the integrated device 206 may include the side with the passivation layer 340, the plurality of die interconnects 320 and/or the plurality of active devices 310. The plurality of active devices 310 may include at least one transistor. The back side of the integrated device 206 may include the side with the die substrate 302. As shown in FIG. 3, the back side of the integrated device 206 (e.g., die substrate of the integrated device) may be coupled to the first surface of the substrate 202, through the attach 260. For example, the back side of the bare die is coupled to the first surface of the substrate 202 through an attach (e.g., 260) die attach, and the front side of the bare die is configured to be electrically coupled to the first surface of the substrate 202 through the plurality of first wire bonds 210.

The plurality of die interconnects 320 may include a plurality of first die interconnects 320a and at least one second die interconnect 320b. The plurality of first die interconnects 320a (e.g., pad) is coupled to the plurality of active devices 310. The at least second die interconnect 320b is coupled to the at least one second wire bond 212. The at least one second die interconnect 320b may be configured to be free of electrical connection with the plurality of active devices 310. That is, the at least one second die interconnect 320b may be configured to be free of electrical connection with transistors of the integrated device 206.

The plurality of first wire bonds 210 is coupled to the plurality of first die interconnects 320a (e.g., wire bond pad) of the integrated device 206. The plurality of first wire bonds 210 is coupled to the plurality of interconnects 222 (e.g., wire bond pad of substrate). Thus, at least one electrical current (e.g., electrical signal) between the integrated device 206 and the substrate 202 may travel through the plurality of first wire bonds 210. In particular, at least one electrical current between the plurality of active devices 310 and the substrate 202 may travel through the plurality of first wire bonds 210.

The at least one second wire bond 212 is coupled to the at least one second die interconnect 320b (e.g., pad). The at least one second die interconnect 320b may be coupled to the at least one die substrate via 330. The at least one die substrate via 330 may travel through the back side of the die substrate 302. Heat from the integrated device 206 may dissipate through the at least one second wire bond 212, the at least second die interconnect 320b and/or the at least one die substrate via 330. The at least one second wire bond 212, the at least second die interconnect 320b and/or the at least one die substrate via 330 may be configured to be free of an electrical connection with the plurality of active devices 310 (e.g., transistors) of the integrated device 206. The at least one second wire bond 212, the at least second die interconnect 320b and/or the at least one die substrate via 330 may be configured to be coupled to ground. In some implementations, the at least one second wire bond 212 may be located as close as 50 micrometers to the plurality of active devices 310. For example, a vertical distance between the at least one wire bond 212 and an active device from the plurality of active devices 310 may be about 50 micrometers or greater.

FIG. 4 illustrates an integrated device 206 that includes the die substrate 302, the plurality of active devices 310 located over the die substrate 302, and the plurality of die interconnects 320, at least one die substrate via 330, at least one die interconnect 430 and a passivation layer 340. The integrated device 206 of FIG. 4 is similar to the integrated device 206 of FIG. 3. However, as shown in FIG. 4, the at least one die interconnect 430 (e.g., pad) is coupled to the at least one die substrate via 330. The at least one die interconnect 430 may be located over the back side of the integrated device 206 (e.g., over the back side of the die substrate 302). The at least one die interconnect 430 may be located over the first surface of the substrate 202. The at least one die interconnect 430 may be coupled to the at least one dielectric layer 220 and/or at least one interconnect located in and/or over the at least one dielectric layer 220.

Figure 5:
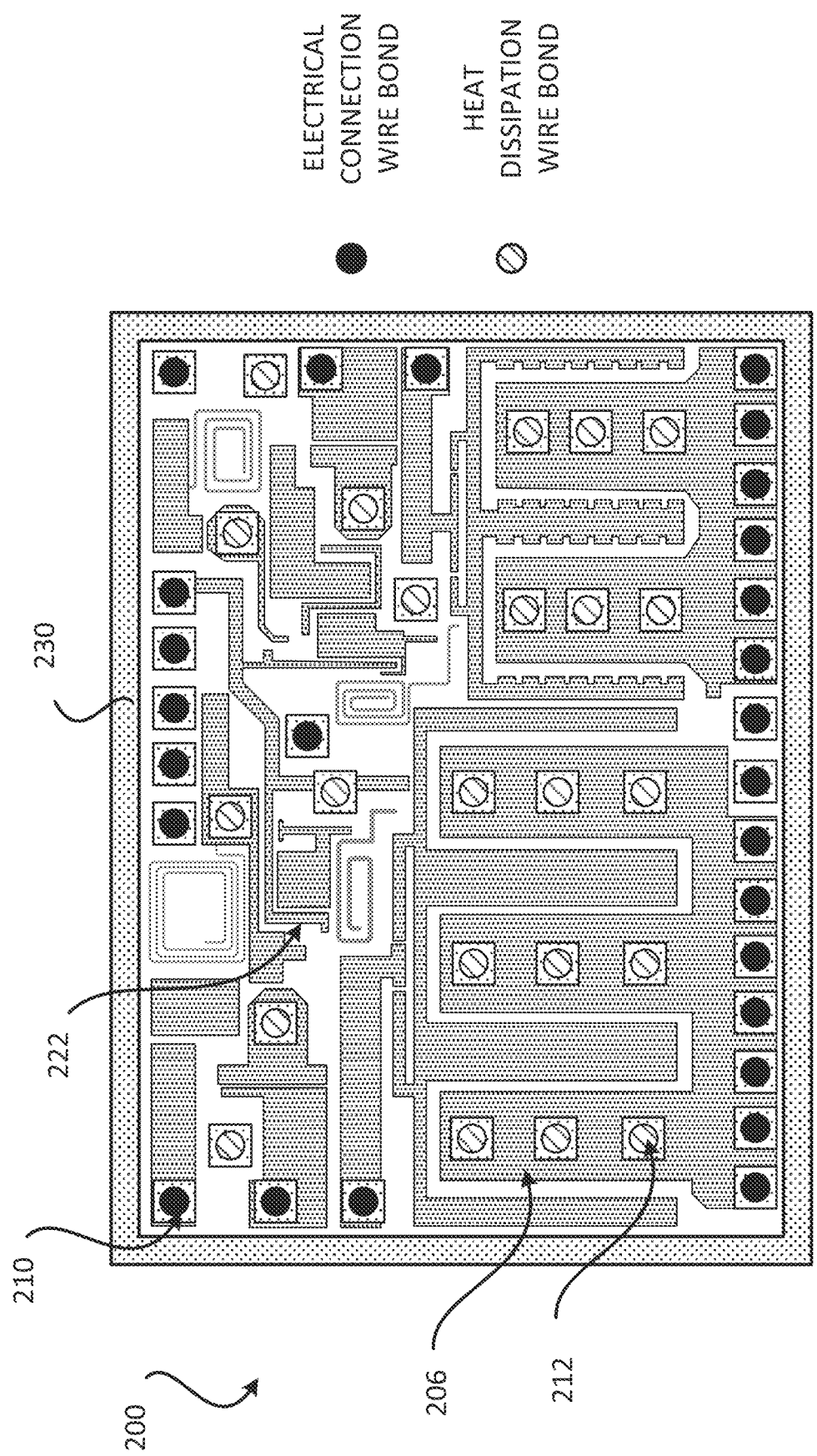
FIG. 5 illustrates a plan view of a package that includes a substrate, an integrated device and wire bonds configured as a heat spreader.

FIG. 5 illustrates a plan view of the package 200 that includes the integrated device 206, the metal layer 230, the plurality of first wire bonds 210, the at least one second wire bond 212, and the plurality of interconnects 222. FIG. 5 may illustrate a top view of the package 200. FIG. 5 illustrates that the plurality of first wire bonds 210 and the at least one second wire bond 212 may be coupled to various components, and is thus not limited to being coupled to integrated devices. Some of the interconnects from the plurality of interconnects 222 may be configured as passive devices, such as an inductor.

Figure 6:
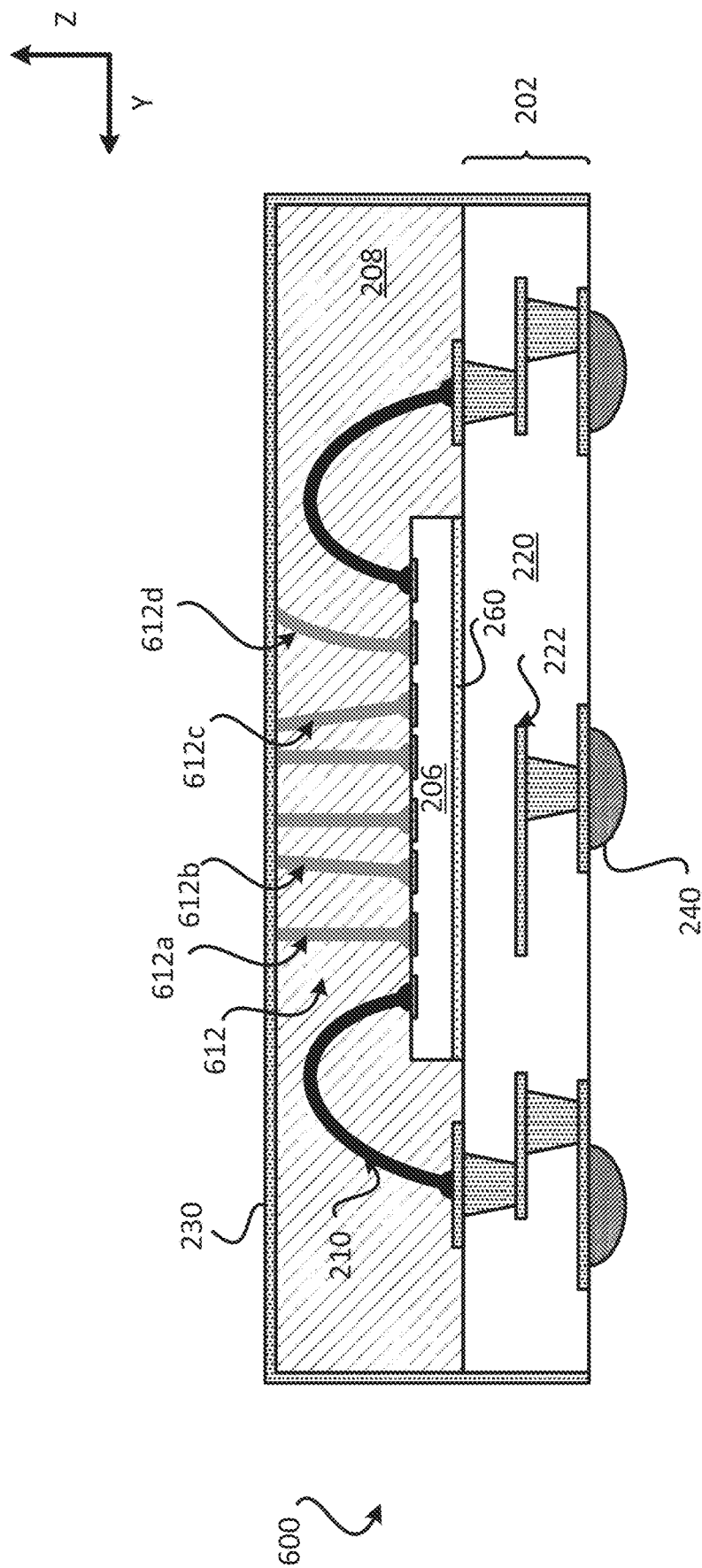
FIG. 6 illustrates a profile view of a package that includes a substrate, an integrated device and wire bonds configured as a heat spreader.

FIG. 6 illustrates a profile view of a package 600. The package 600 is similar to the package 200. Thus, the package 600 includes similar components and/or the same components as the package 200. FIG. 6 illustrates that at least some of the wire bonds that are configured for heat dissipation may be aligned and/or oriented in different directions. The package 600 includes the substrate 202, the integrated device 206, the plurality of first wire bonds 210, at least one second wire bond 612 (e.g., 612a-612d), the encapsulation layer 208, and the metal layer 230. The at least one second wire bond 612 may be a means for wire heat dissipation. The at least one second wire bond 612 is similar to the at least one second wire bond 212, and may be coupled to the integrated device 206 in a similar manner as described in FIGS. 2-4. The at least one second wire bond 612 may include at least one vertical wire bond, at least one diagonal wire bond, at least one curved wire bond, at least one non-linear wire bond, or combinations thereof. A wire bond that travels vertically (e.g., extends vertically) may extend vertically linearly and/or non-linearly, with respect to a surface of a component. A wire bond that travels vertically may extend away from a surface of a component to which the wire bond is coupled to. A wire bond that travels vertically may include a wire bond that extends diagonally (linearly and/or non-linearly).

Figure 7:
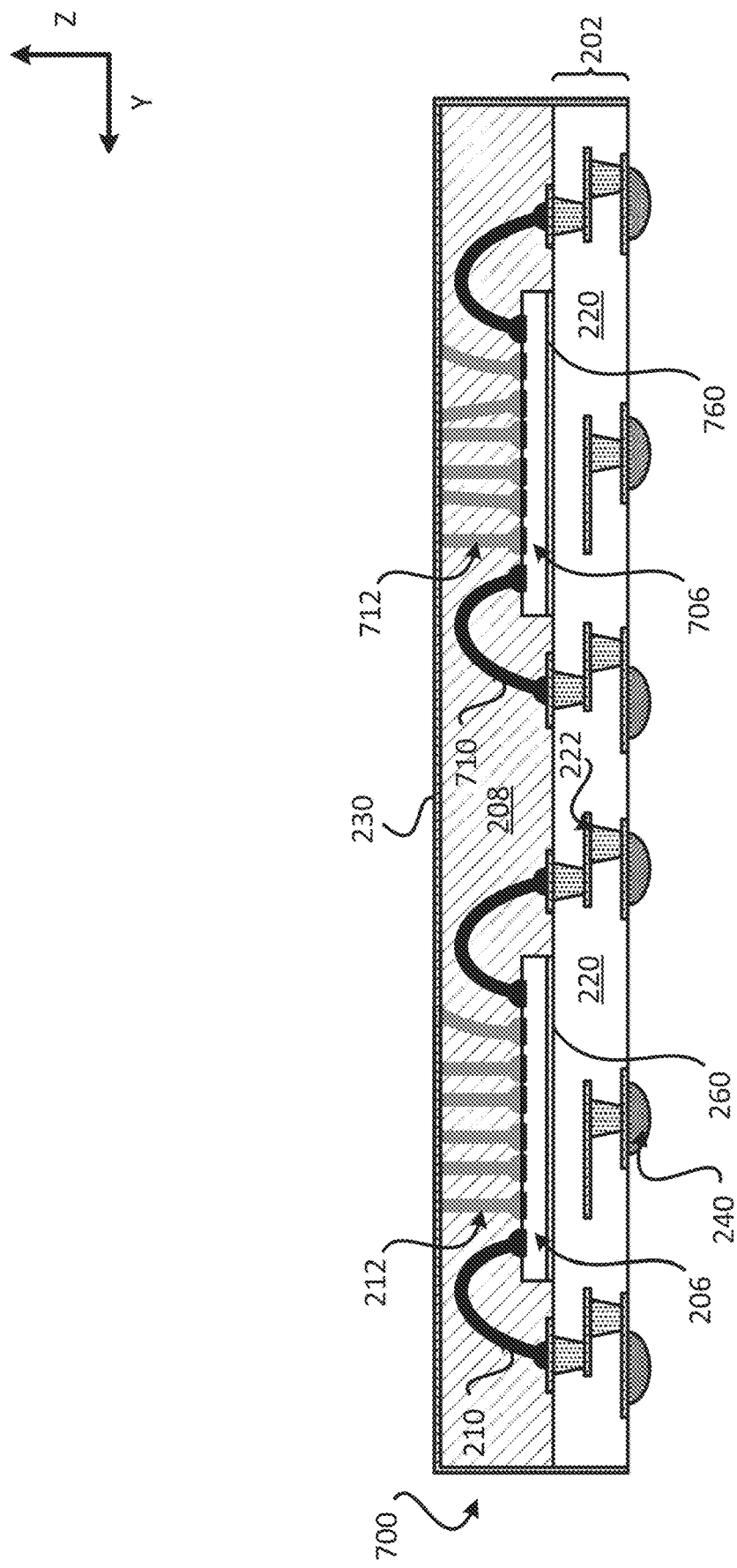
FIG. 7 illustrates a profile view of a package that includes a substrate, several integrated devices and wire bonds configured as a heat spreader.

FIG. 7 illustrates a profile view of a package 700. The package 700 is similar to the package 200 and/or the package 600. Thus, the package 700 includes similar components and/or the same components as the package 200 and/or the package 600. FIG. 7 illustrates that a package may include more than one integrated device. The package 700 includes the substrate 202, the integrated device 206, the plurality of first wire bonds 210, at least one second wire bond 212, an integrated device 706, a plurality of first wire bonds 710, at least one second wire bond 712, the encapsulation layer 208, and the metal layer 230. The plurality of first wire bonds 710 is similar to the plurality of wire bonds 210, and may be coupled to the integrated device 706 in a similar manner as described in FIGS. 2-4. Similarly, the at least one second wire bond 712 is similar to the at least one second wire bond 612, and may be coupled to the integrated device 706 in a similar manner as described in FIGS. 2-4 and 6. The integrated device (e.g., 206, 706) may include a power amplifier. The package (e.g., 200, 600, 700) may include a radio frequency front end (RFFE) package.

An integrated device (e.g., 206, 706) may include a die (e.g., bare die). The integrated device may include a radio frequency (RF) device, an analog device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a silicon (Si) based integrated device, a silicon carbide (SiC) based integrated device, a GaAs based integrated device, a GaN based integrated device, a memory, power management processor, and/or combinations thereof.

Having described various packages that include wire bonds as a heat spreader, various methods for fabricating the substrate and the package will now be described below.

Exemplary Sequence for Fabricating a Substrate

Figure 8A:
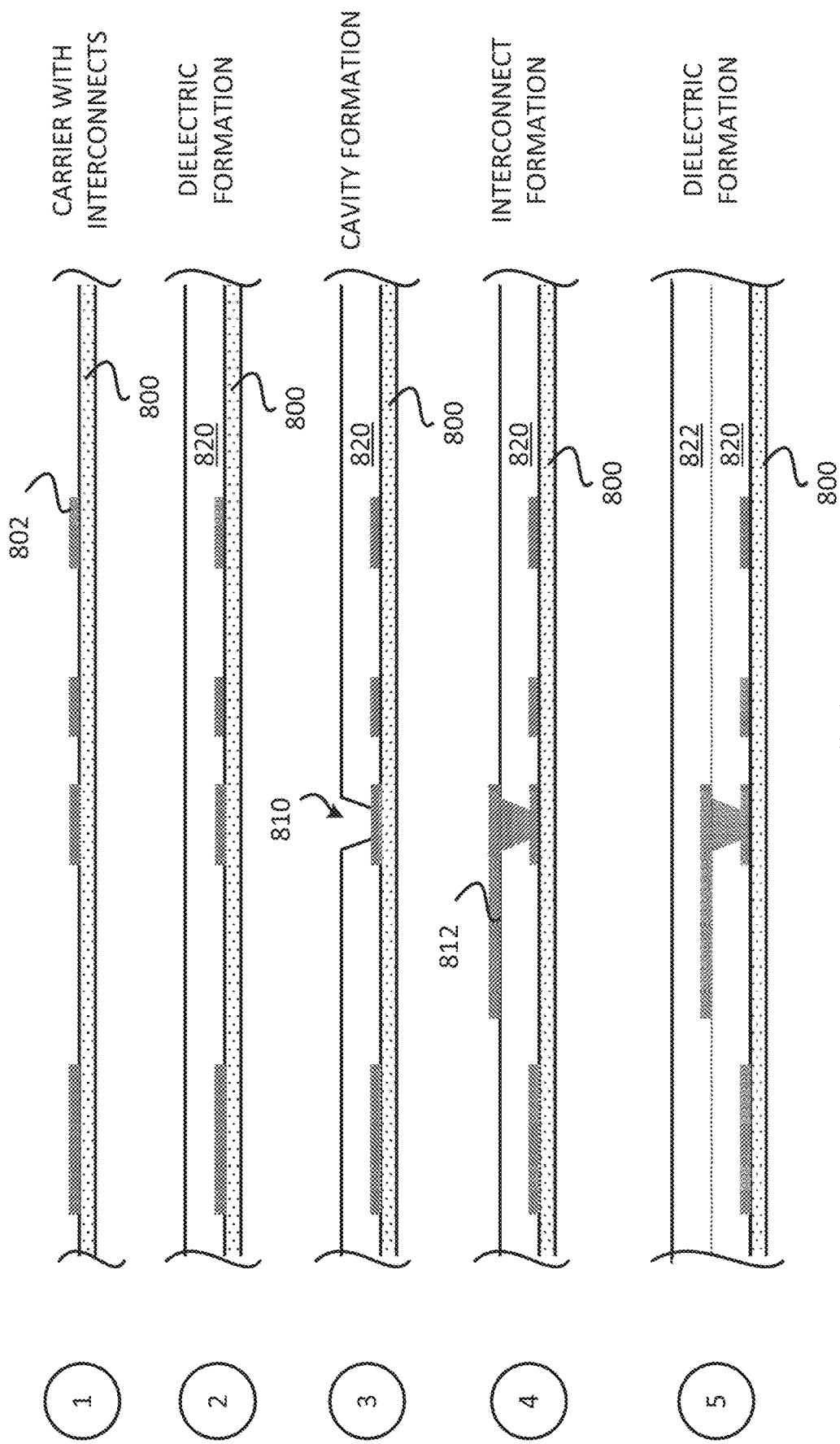
FIGS. 8A-8B illustrate an exemplary sequence for fabricating a substrate.
Figure 8B:
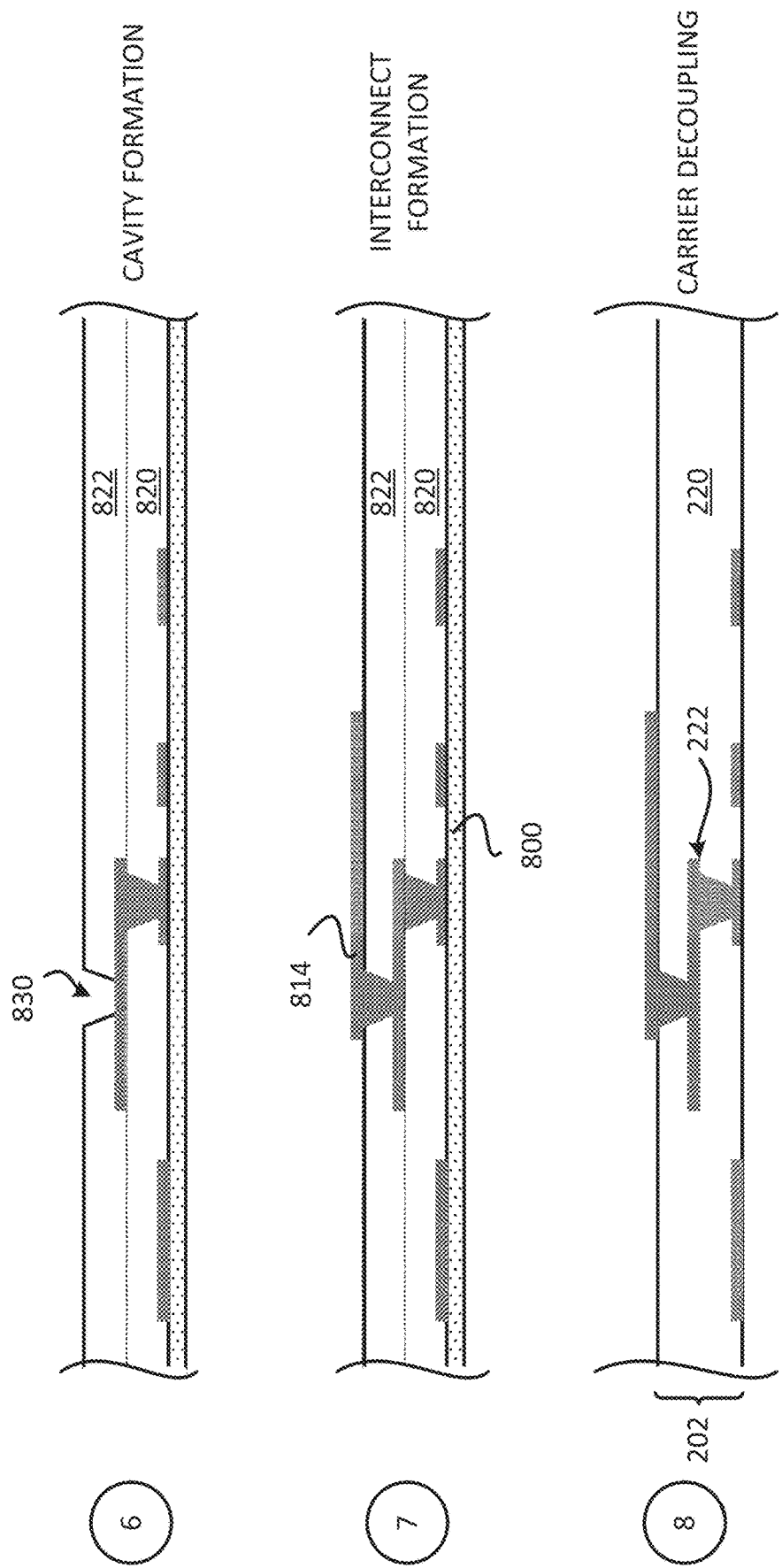

In some implementations, fabricating a substrate includes several processes. FIGS. 8A-8B illustrate an exemplary sequence for providing or fabricating a substrate. In some implementations, the sequence of FIGS. 8A-8B may be used to provide or fabricate the substrate 202 of FIG. 2. However, the process of FIGS. 8A-8B may be used to fabricate any of the substrates described in the disclosure. It is noted that other types of substrates may be used instead of the substrate shown in FIGS. 8A-8B.

It should be noted that the sequence of FIGS. 8A-8B may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 8A, illustrates a state after a carrier 800 is provided and a metal layer is formed over the carrier 800. The metal layer may be patterned to form interconnects 802. A plating process and etching process may be used to form the metal layer and interconnects.

Stage 2 illustrates a state after a dielectric layer 820 is formed over the carrier 800 and the interconnects 802. A deposition process may be used to form the dielectric layer 820. The dielectric layer 820 may include polyimide. However, different implementations may use different materials for the dielectric layer.

Stage 3 illustrates a state after at least one cavity 810 is formed in the dielectric layer 820. The at least one cavity 810 may be formed using an etching process (e.g., photo etching process) or a laser process.

Stage 4 illustrates a state after interconnects 812 are formed in and over the dielectric layer 820. For example, a via, pad and/or traces may be formed. A plating process may be used to form the interconnects. The interconnects 812 may be part of the plurality of interconnects 222.

Stage 5 illustrates a state after another dielectric layer 822 is formed over the dielectric layer 820. A deposition process may be used to form the dielectric layer 822. The dielectric layer 822 may be the same material as the dielectric layer 820. However, different implementations may use different materials for the dielectric layer (e.g., 820, 822).

Stage 6, as shown in FIG. 8B, illustrates a state after at least one cavity 830 is formed in the dielectric layer 822. An etching process or a laser process may be used to form the at least one cavity 830.

Stage 7 illustrates a state after interconnects 814 are formed in and over the dielectric layer 822. For example, via, pad and/or trace may be formed. A plating process may be used to form the interconnects. The interconnects 814 may be part of the plurality of interconnects 222.

Stage 8 illustrates a state after the carrier 800 is decoupled (e.g., removed, grinded out, dissolved) from the at least one dielectric layer 220, leaving the substrate 202. The at least one dielectric layer 220 may represent the dielectric layer 820 and the dielectric layer 822. The plurality of interconnects 222 may represent the plurality of interconnects 802, 812 and/or 814. Stage 8 may illustrate the substrate 202 of FIG. 2.

Different implementations may use different processes for forming the metal layer(s). In some implementations, a chemical vapor deposition (CVD) process and/or a physical vapor deposition (PVD) process may be used for forming the metal layer(s). For example, a sputtering process, a spray coating process, and/or a plating process may be used to form the metal layer(s).

Exemplary Flow Diagram of a Method for Fabricating a Substrate

Figure 9:
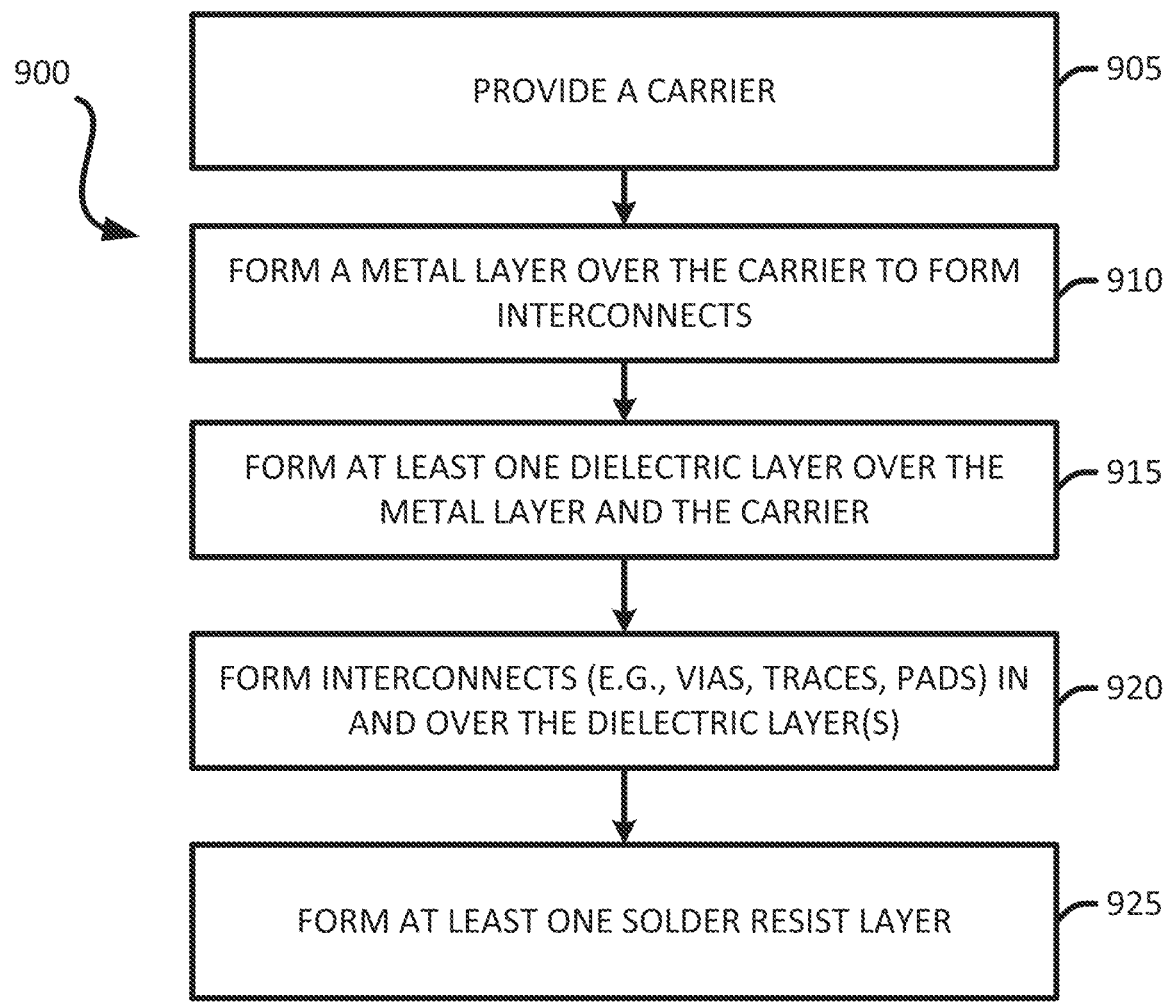
FIG. 9 illustrates an exemplary flow diagram of a method for fabricating a substrate.

In some implementations, fabricating a substrate includes several processes. FIG. 9 illustrates an exemplary flow diagram of a method 900 for providing or fabricating a substrate. In some implementations, the method 900 of FIG. 9 may be used to provide or fabricate the substrate 202 of FIG. 2, or any of the substrates described in the disclosure.

It should be noted that the method of FIG. 9 may combine one or more processes in order to simplify and/or clarify the method for providing or fabricating a substrate. In some implementations, the order of the processes may be changed or modified.

The method provides (at 905) a carrier 800. Different implementations may use different materials for the carrier. The carrier may include a substrate, glass, quartz and/or carrier tape. Stage 1 of FIG. 8A illustrates an example after a carrier is provided.

The method forms (at 910) a metal layer over the carrier 800. The metal layer may be patterned to form interconnects. A plating process may be used to form the metal layer and interconnects. Stage 1 of FIG. 8A illustrates an example after a metal layer and interconnects 802 are formed.

The method forms (at 915) at least one dielectric layer (e.g., dielectric layer 820) over the carrier 800 and the interconnects 802. The dielectric layer 820 may include polyimide. Forming the dielectric layer may also include forming a plurality of cavities (e.g., 810) in the dielectric layer 820. A deposition process may be used to form the at least one dielectric layer. The plurality of cavities may be formed using an etching process (e.g., photo etching) or laser process. Stages 2-3 of FIG. 8A illustrate an example of forming a dielectric layer and cavities in the dielectric layer.

The method forms (at 920) interconnects in and over the dielectric layer. For example, the interconnects 812 may be formed in and over the dielectric layer 820. A plating process may be used to form the interconnects. Forming interconnects may include providing a patterned metal layer over and/or in the dielectric layer. Stage 4 of FIG. 8A illustrates an example of forming interconnects in and over a dielectric layer.

In some implementations, several dielectric layers (e.g., 822) and several interconnects (e.g., 814) may be formed in and over the dielectric layers. Stages 2-8 of FIGS. 8A-8B illustrate examples of forming at least one dielectric layer and a plurality of interconnects in and over the dielectric layer(s).

The method forms (at 925) a solder resist layer over the at least one dielectric layer (e.g., 220) and the at least one interconnect 222. A deposition process may be used to form the solder resist layer(s).

Different implementations may use different processes for forming the metal layer(s). In some implementations, a chemical vapor deposition (CVD) process and/or a physical vapor deposition (PVD) process may be used for forming the metal layer(s). For example, a sputtering process, a spray coating process, and/or a plating process may be used to form the metal layer(s).

Figure 10A:
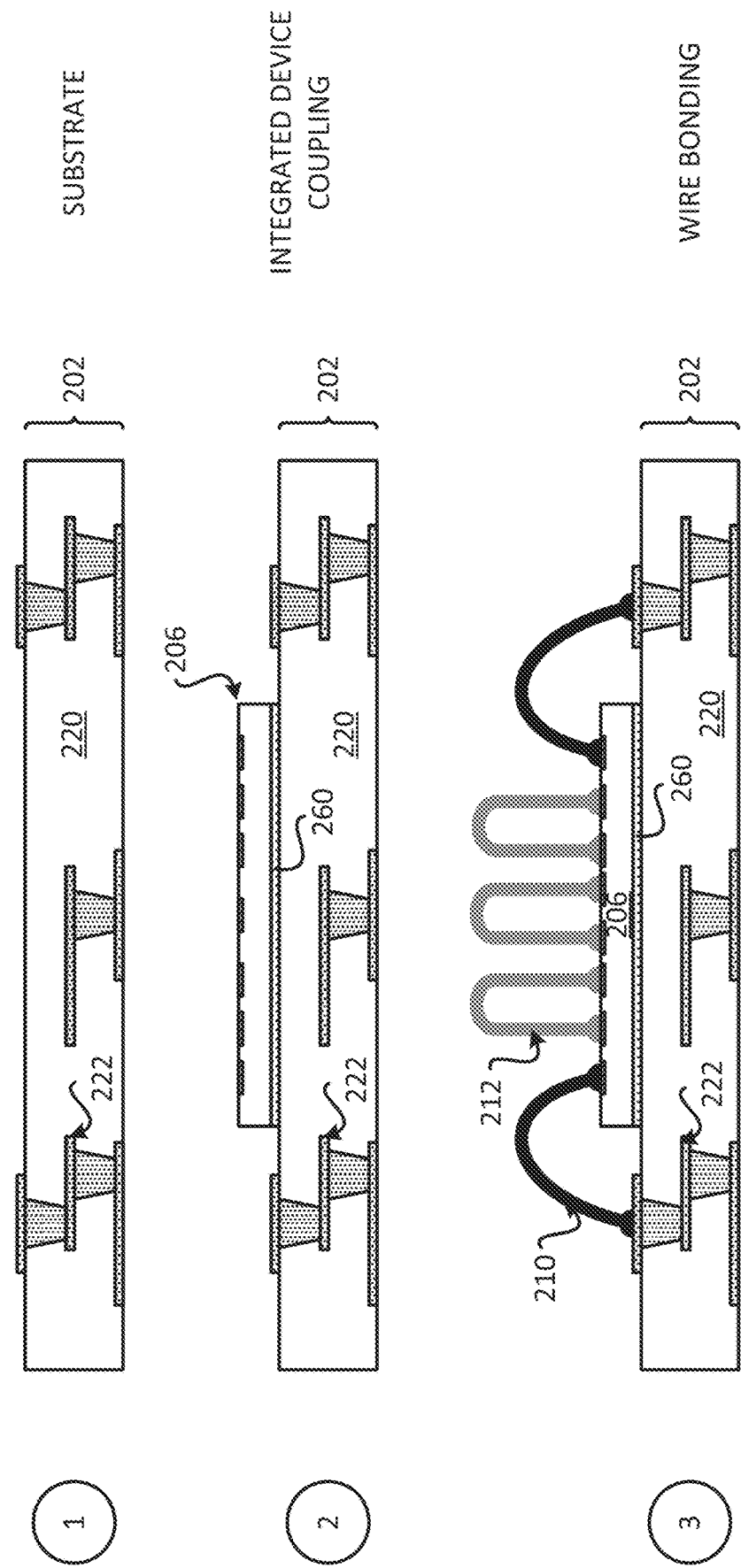
Figure 10B:
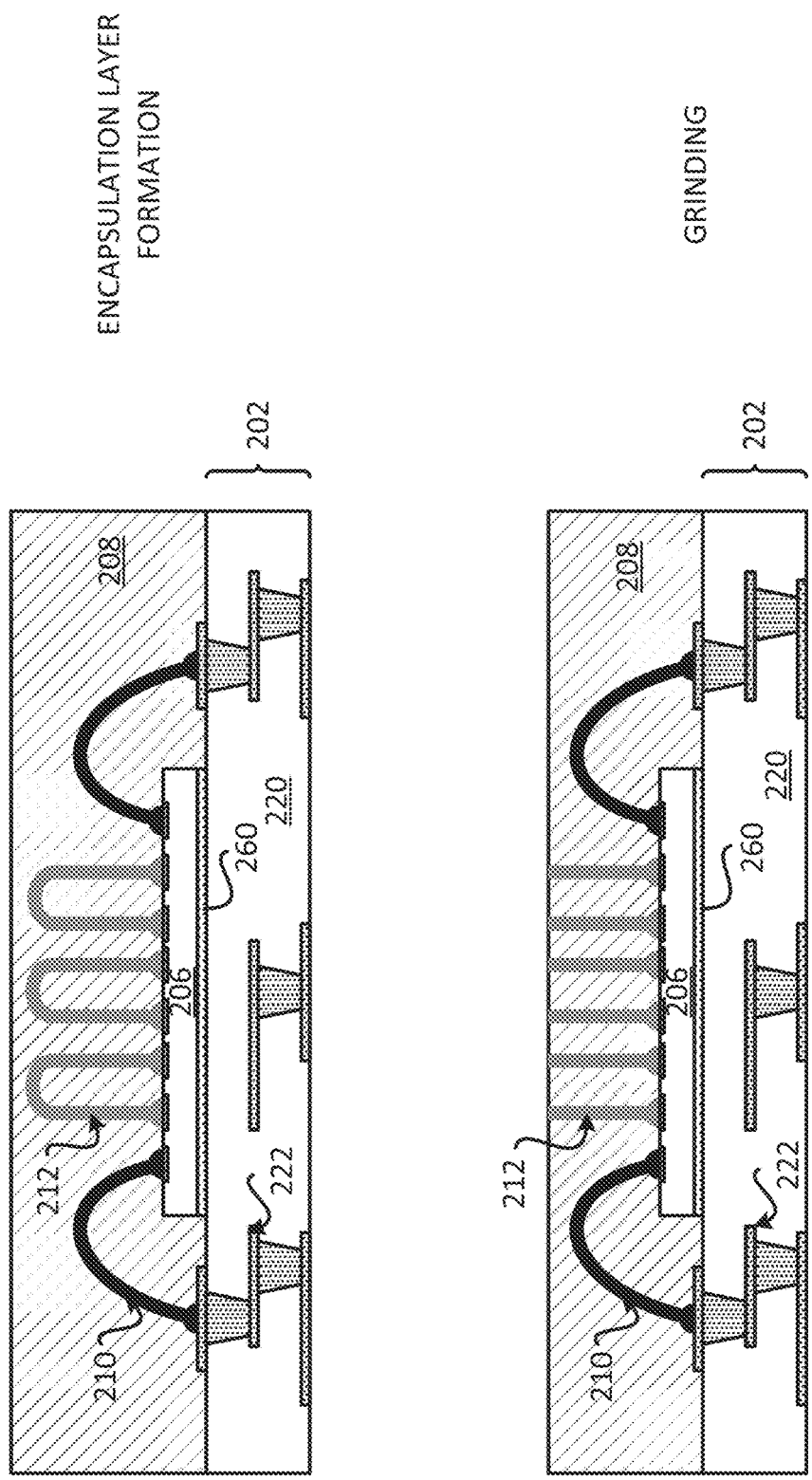

Exemplary Sequence for Fabricating a Package that Includes a Substrate, an Integrated Device and Wire Bonds Configured as a Heat Spreader FIGS. 10A-10C illustrate an exemplary sequence for providing or fabricating a package that includes wire bonds configured as a heat spreader. In some implementations, the sequence of FIGS. 10A-10C may be used to provide or fabricate the package 200 of FIG. 2, or any of the packages described in the disclosure.

It should be noted that the sequence of FIGS. 10A-10C may combine one or more stages in order to simplify and/or clarify the sequence for providing or fabricating the package. In some implementations, the order of the processes may be changed or modified. In some implementations, one or more of processes may be replaced or substituted without departing from the spirit of the disclosure. The sequence of FIGS. 10A-10C may be used to fabricate one package or several packages at a time (as part of a wafer).

Stage 1, as shown in FIG. 10A, illustrates a state after a substrate 202 is provided. The substrate 202 may be provided by a supplier or fabricated. A process similar to the process shown in FIGS. 8A-8B may be used to fabricate the substrate 202. However, different implementations may use different types of substrate and/or may use different processes to fabricate a substrate. Examples of processes that may be used to fabricate a substrate include a semi-additive process (SAP) and a modified semi-additive process (mSAP).

The substrate 202 includes a first surface (e.g., top surface) and a second surface (e.g., bottom surface). The substrate 202 includes at least one dielectric layer 220 and a plurality of interconnects 222. The plurality of interconnects 222 is located at least in and over the at least one dielectric layer 220. As mentioned above, the substrate 202 may include a solder resist layer on the first surface and another solder resist layer on the second surface of the substrate 202.

Stage 2 illustrates a state after the back side of the integrated device 206 is coupled to the first surface (e.g., top surface) of the substrate 202. The integrated device 206 may be coupled to the substrate 202 through an attach 260 (e.g., die attach). The integrated device 206 may include a power amplifier.

Stage 3 illustrates a state after a plurality of wire bonds are formed and coupled to the integrated device 206 and/or the substrate 202. A wire bonding process may be used to couple the plurality of first wire bonds 210 to the integrated device 206 and the substrate 202. The plurality of first wire bonds 210 may be coupled to interconnects (e.g., 320a) of the integrated device 206 and interconnects (e.g., 222) of the substrate 202. For example, the plurality of first wire bonds 210 may be coupled to pads of the integrated device 206 and pads of the substrate 202. The wire bonding process may further be used to couple at least one second wire bond 212 to the integrated device 206. For example, the at least one second wire bond 212 may be coupled to pads of the integrated device 206. The at least one second wire bond 212 may travel and/or extend in different directions (e.g., vertically, diagonally, curved, non-linearly), as illustrated and described in at least FIGS. 6 and 7 above.

Stage 4, as shown in FIG. 10B, illustrate a state after the encapsulation layer 208 is formed over the first surface of the substrate 202 such that the encapsulation layer 208 encapsulates the integrated device 206, the plurality of first wire bonds 210 and the at least one second wire bond 212. The encapsulation layer 208 may include a mold, a resin and/or an epoxy. The process of forming and/or disposing the encapsulation layer 208 may include using a compression and transfer molding process, a sheet molding process, or a liquid molding process.

Stage 5 illustrates a state after portions of the encapsulation layer 208 and portions of the at least one second wire bond 212 are removed. A grinding process (e.g., strip grinding process) may be used to remove portions of the encapsulation layer 208 and portions of the at least one second wire bond 212. A top portion of the at least one second wire bond 212 may be co-planar with a top surface (e.g., top outer surface) of the encapsulation layer 208.

Stage 6, as shown in FIG. 10C, illustrates a state after the metal layer 230 is formed over the outer surface of the encapsulation layer 208 and the side surface of the substrate 202. The metal layer 230 may be configured as an EMI shield (e.g., means for electromagnetic interference (EMI) shield). A sputtering process, a spray coating, and/or a plating process may be used to form the metal layer 230. The metal layer 230 may include an electrically conductive layer. The metal layer 230 may be formed over and coupled to the at least second wire bond 212. The metal layer 230 may be configured to be coupled to ground.

Stage 7 illustrates a state after the plurality of solder interconnects 240 is coupled to the plurality of interconnects 222 through a reflow process. The plurality of solder interconnects 240 may be coupled to the second surface (e.g., bottom surface) of the substrate 202. Stages 6 and/or 7 may illustrate the package 200.

The packages (e.g., 200, 400, 600, 700) described in the disclosure may be fabricated one at a time or may be fabricated together as part of one or more wafers and then singulated into individual packages.

Figure 11:
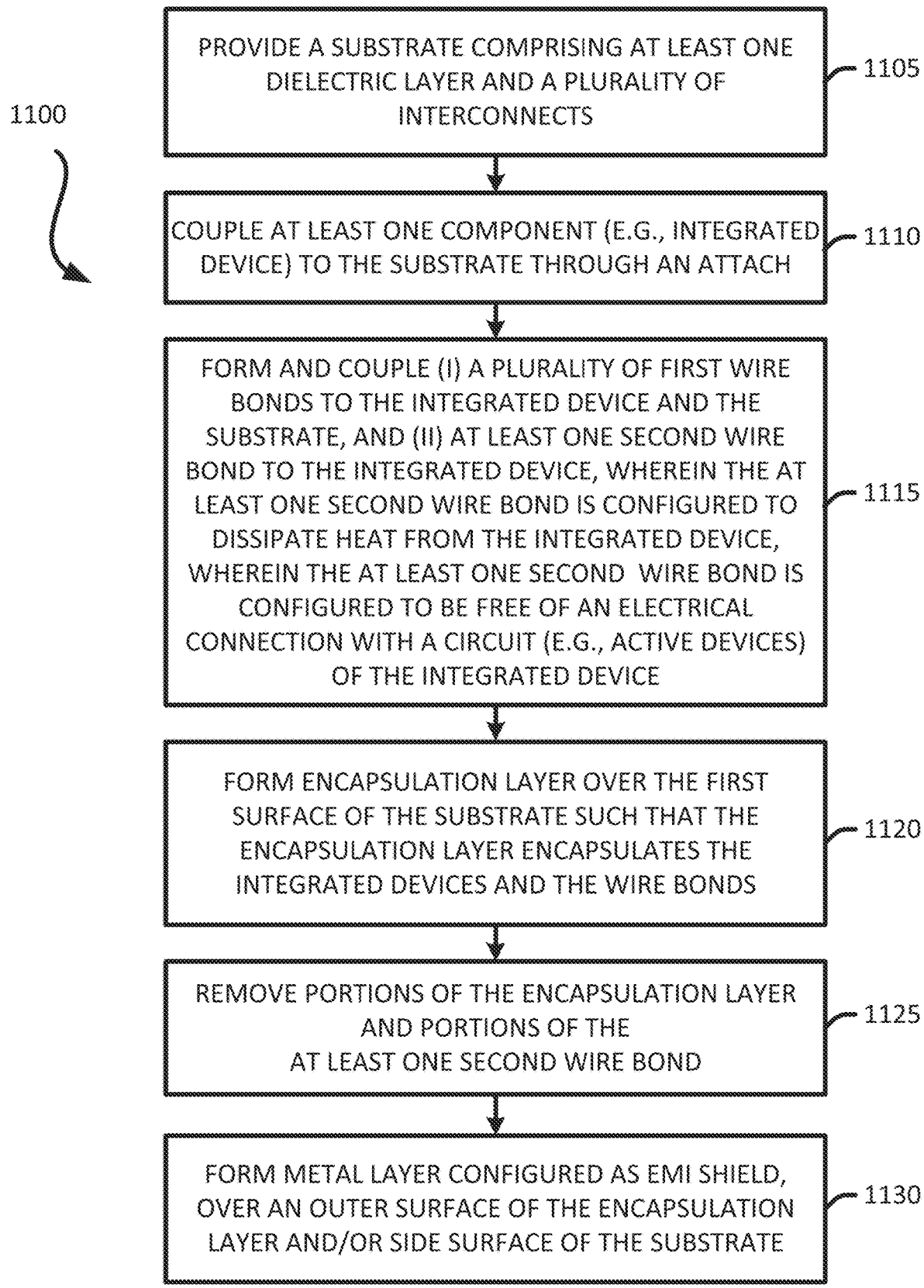
FIG. 11 illustrates an exemplary flow diagram of a method for fabricating a package that includes a substrate, an integrated device and wire bonds configured as a heat spreader.

Exemplary Flow Diagram of a Method for Fabricating a Package That Includes a Substrate, an Integrated Device and Wire Bonds Configured as a Heat Spreader In some implementations, fabricating a package that includes wire bonds as a heat spreader includes several processes. FIG. 11 illustrates an exemplary flow diagram of a method 1100 for providing or fabricating a package that includes wire bonds as a heat spreader. In some implementations, the method 1100 of FIG. 11 may be used to provide or fabricate the package 200 of FIG. 2 described in the disclosure. However, the method 1100 may be used to provide or fabricate any of the packages described in the disclosure.

It should be noted that the method of FIG. 11 may combine one or more processes in order to simplify and/or clarify the method for providing or fabricating a package. In some implementations, the order of the processes may be changed or modified.

The method provides (at 1105) a substrate (e.g., 202). The substrate 202 may be provided by a supplier or fabricated. The substrate 202 includes a first surface (e.g., top surface) and a second surface (e.g., bottom surface). The substrate 202 may include at least one dielectric layer 220 and a plurality of interconnects 222. The plurality of interconnects 222 is located at least in and over the at least one dielectric layer 220.

Different implementations may provide different substrates. A process similar to the process shown in FIGS. 8A-8B may be used to fabricate the substrate 202. However, different implementations may use different types of substrate and may use different processes to fabricate the substrate 202. Stage 1 of FIG. 10A illustrates and describes an example of providing a substrate.

The method couples (at 1110) at least one component (e.g., power amplifier, integrated device) to the substrate (e.g., 202). For example, the method may couple the back side of the integrated device 206 to a first surface (e.g., top surface) of the substrate 202 through the attach 260. Stage 2 of FIG. 10A illustrates and describes an example of coupling at least one component to a substrate.

The method forms and couples (at 1115) a plurality of wire bonds to the integrated device 206 and/or the substrate 202. A wire bonding process may be used to couple a plurality of first wire bonds 210 to the integrated device 206 and the substrate 202. The plurality of first wire bonds 210 may be coupled to interconnects (e.g., 320a) of the integrated device 206 and interconnects (e.g., 222) of the substrate 202. For example, the plurality of first wire bonds 210 may be coupled to pads of the integrated device 206 and pads of the substrate 202. The wire bonding process may further be used to form and couple at least one second wire bond 212 to the integrated device 206. For example, the at least one second wire bond 212 may be coupled to pads of the integrated device 206. The at least one second wire bond 212 may travel and/or extend in different directions (e.g., vertically, diagonally, curved, non-linearly). Stage 3 of FIG. 10A illustrates and describes an example of forming wire bonds.

The method forms (at 1120) an encapsulation layer (e.g., 208) over the first surface of the substrate (e.g., 202). The encapsulation layer may be formed over the first surface of the substrate such that the encapsulation layer 208 encapsulates the integrated device 206, the plurality of first wire bonds 210 and the at least one second wire bond 212. The encapsulation layer may be coupled to the first surface of the substrate. The process of forming and/or disposing the encapsulation layer 208 may include using a compression and transfer molding process, a sheet molding process, or a liquid molding process. Stage 4 of FIG. 10B, illustrates and describes an example of an encapsulation layer that is located over the substrate and encapsulates the integrated device and wire bonds.

The method removes (at 1125) portions of the encapsulation layer 208 and portions of the at least one second wire bond 212. A grinding process (e.g., strip grinding process) may be used to remove portions of the encapsulation layer 208 and portions of the at least one second wire bond 212. However, different implementations may use different processes for removing portion of the encapsulation layer and/or portions of the at least one second wire bond. Stage 5 of FIG. 10B illustrates and describes an example of portions of the encapsulation layer and portions of wire bonds that are removed.

The method forms (at 1130) a metal layer 230 over the outer surface of the encapsulation layer 208 and the side surface of the substrate 202. The metal layer 230 may be configured as an EMI shield. A sputtering process, a spray coating, and/or a plating process may be used to form the metal layer 230. The metal layer 230 may include an electrically conductive layer. The metal layer 230 may be formed and coupled to the at least second wire bond 212. The metal layer 230 may be configured to be coupled to ground. Stage 6 of FIG. 10C illustrates and describes an example of a metal layer formed over an encapsulation layer and configured as an EMI shield.

The method may couple a plurality of solder interconnects (e.g., 240) to the substrate (e.g., 202). A reflow process may be used to couple the solder interconnects 240 to the plurality of interconnects 222 of the substrate 202. Stage 8 of FIG. 10C illustrates and describes an example of coupling solder interconnects to a substrate.

Exemplary Electronic Devices

Figure 12:
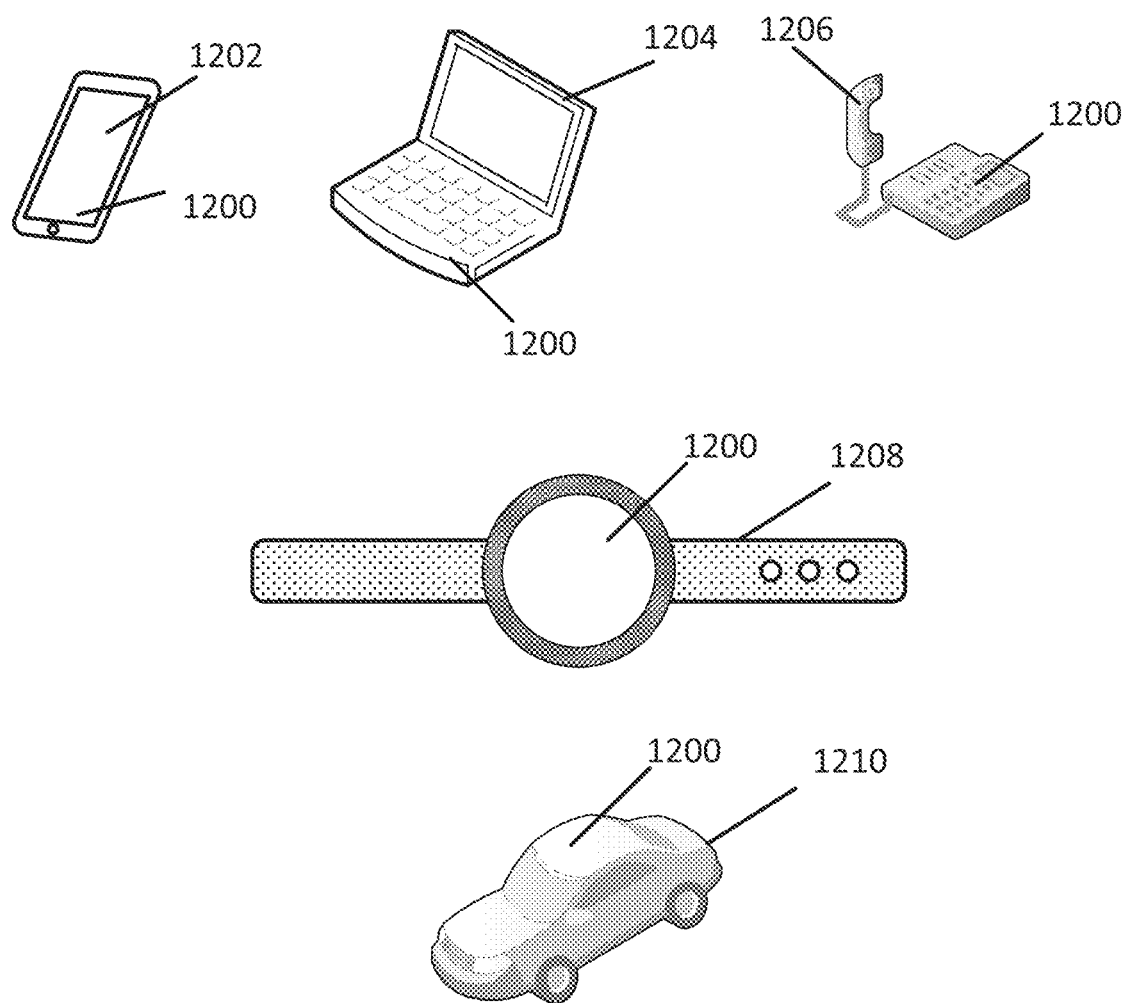
FIG. 12 illustrates various electronic devices that may integrate a die, an integrated device, an integrated passive device (IPD), a passive component, a package, and/or a device package described herein.

FIG. 12 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1202, a laptop computer device 1204, a fixed location terminal device 1206, a wearable device 1208, or automotive vehicle 1210 may include a device 1200 as described herein. The device 1200 may be, for example, any of the devices and/or integrated circuit (IC) packages described herein. The devices 1202, 1204, 1206 and 1208 and the vehicle 1210 illustrated in FIG. 12 are merely exemplary. Other electronic devices may also feature the device 1200 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-7, 8A-8B, 9, 10A-10C and/or 11-12 may be rearranged and/or combined into a single component, process, feature or function or embodied in several components, processes, or functions. Additional elements, components, processes, and/or functions may also be added without departing from the disclosure. It should also be noted FIGS. 2-7, 8A-8B, 9, 10A-10C and/or 11-12 and its corresponding description in the present disclosure is not limited to dies and/or ICs. In some implementations, FIGS. 2-7, 8A-8B, 9, 10A-10C and/or 11-12 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   a substrate;
   an integrated device coupled to the substrate, wherein the integrated device comprises:
      a die substrate;
      a plurality of active devices located over the die substrate;
      a plurality of first die interconnects coupled to the plurality of active devices;
      at least one second die interconnect configured to be free of electrical connection with the plurality of active devices; and
      at least one die substrate via coupled to the at least one second die interconnect, wherein the at least one die substrate via extends through a back side of the integrated device;
   a plurality of first wire bonds coupled to the integrated device and the substrate, wherein the plurality of first wire bonds is configured to provide at least one electrical path between the integrated device and the substrate;
   at least one second wire bond coupled to the integrated device,
      wherein the at least one second wire bond is configured to be coupled to the at least one second die interconnect of the integrated device, and
      wherein the at least one second wire bond is configured to be free of an electrical connection with the plurality of active devices of the integrated device; and
   an encapsulation layer located over the substrate and the integrated device, wherein the encapsulation layer encapsulates the integrated device, the plurality of first wire bonds and the at least one second wire bond.

2. The package of claim 1,
   wherein the at least one second wire bond is configured to dissipate heat from the integrated device by providing a thermally conductive path for heat to dissipate from the integrated device.

3. The package of claim 1, further comprising a metal layer formed over an outer surface of the encapsulation layer, wherein the metal layer is configured as an electromagnetic interference (EMI) shield.

4. The package of claim 3, wherein the at least one second wire bond is coupled to the metal layer.

5. The package of claim 1, wherein the integrated device includes a bare die.

6. The package of claim 1, wherein the at least one die substrate via is located in the die substrate of the integrated device.

7. The package of claim 1, wherein the plurality of active devices is part of a circuit for the integrated device.

8. The package of claim 1, wherein the plurality of active devices includes a plurality of transistors.

9. The package of claim 1, wherein the integrated device further comprises at least one die interconnect coupled to (i) a back side of the die substrate and (ii) the at least one die substrate via.

10. The package of claim 1,
where the integrated device includes a back side and a front side,
wherein the back side of the integrated device is coupled to a first surface of the substrate through a die attach, and
wherein the front side of the integrated device is electrically coupled to the first surface of the substrate through the plurality of first wire bonds.

11. The package of claim 1, wherein an end portion of the at least second wire bond is located away from the integrated device and the substrate.

12. The package of claim 1, wherein the at least one second wire bond includes at least one vertical wire bond, at least one diagonal wire bond, at least one curved wire bond, at least one non-linear wire bond, or combinations thereof.

13. The package of claim 1, wherein the integrated device includes a power amplifier.

14. The package of claim 1, wherein the package includes a radio frequency front end (RFFE) package.

15. An apparatus comprising:
a substrate;
an integrated device coupled to the substrate, wherein the integrated device comprises:
a die substrate;
a plurality of transistors located over the die substrate;
at least one die interconnect configured to be free of electrical connection with the plurality of transistors; and
at least one die substrate via coupled to the at least one die interconnect, wherein the at least one die substrate via extends through the die substrate;
means for wire interconnection coupled to the integrated device and the substrate, wherein the means for wire interconnection is configured to provide at least one electrical path between the integrated device and the substrate;
means for wire heat dissipation coupled to the integrated device, wherein the means for wire heat dissipation is configured to be free of an electrical connection with the plurality of transistors of the integrated device; and
means for encapsulation located over the substrate and the integrated device, wherein the means for encapsulation encapsulates the integrated device, the means for wire interconnection and the means for wire heat dissipation.

16. The apparatus of claim 15, wherein the means for wire heat dissipation is configured to dissipate heat from the integrated device by providing a thermally conductive path for heat to dissipate from the integrated device.

17. The apparatus of claim 15, further comprising means for electromagnetic interference (EMI) shield located over an outer surface of the means for encapsulation.

18. The apparatus of claim 17, wherein the means for wire heat dissipation is coupled to the means for EMI shield.

19. The apparatus of claim 15, wherein the integrated device includes a bare die.

20. The apparatus of claim 15, wherein the integrated device further comprises a plurality of first die interconnects coupled to the plurality of transistors.

21. The apparatus of claim 15, wherein the means for wire heat dissipation is configured to be coupled to the at least one die interconnect.

22. The apparatus of claim 15, wherein the integrated device further comprises a plurality of first die interconnects coupled to the plurality of transistors.

23. The apparatus of claim 15,
where the integrated device includes a bare die comprising a back side and a front side,
wherein the back side of the bare die is coupled to a first surface of the substrate through a die attach, and
wherein the front side of the bare die is electrically coupled to the first surface of the substrate through the means for wire interconnection.

24. The apparatus of claim 15, wherein the means for wire heat dissipation includes at least one vertical wire bond, at least one diagonal wire bond, at least one curved wire bond, at least one non-linear wire bond, or combinations thereof.

25. A device comprising a package, the package comprising:
a substrate;
an integrated device coupled to the substrate, wherein the integrated device comprises:
a die substrate;
a plurality of transistors located over the die substrate;
at least one die interconnect configured to be free of electrical connection with the plurality of transistors; and
at least one die substrate via coupled to the at least one die interconnect, wherein the at least one die substrate via extends through the die substrate;
a plurality of first wire bonds coupled to the integrated device and the substrate, wherein the plurality of first wire bonds is configured to provide at least one electrical path between the integrated device and the substrate;
at least one second wire bond coupled to the at least one die interconnect of the integrated device, wherein the at least one second wire bond is configured to be free of an electrical connection with the plurality of transistors of the integrated device; and
an encapsulation layer located over the substrate and the integrated device, wherein the encapsulation layer encapsulates the integrated device, the plurality of first wire bonds and the at least one second wire bond.

26. The device of claim 25, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

27. A method for fabricating package, comprising:
providing a substrate;
coupling an integrated device to the substrate, wherein the integrated device comprises:
a die substrate;
a plurality of transistors located over the die substrate;

at least one die interconnect configured to be free of electrical connection with the plurality of transistors; and at least one die substrate via coupled to the at least one die interconnect, wherein the at least one die substrate via extends through the die substrate;

coupling a plurality of first wire bonds to the integrated device and the substrate, wherein the plurality of first wire bonds is configured to provide at least one electrical path between the integrated device and the substrate;

coupling at least one second wire bond to the integrated device, wherein the at least one second wire bond is configured to be free of an electrical connection with the plurality of transistors of the integrated device; and forming an encapsulation layer over the substrate and the integrated device, wherein the encapsulation layer encapsulates the integrated device, the plurality of first wire bonds and the at least one second wire bond.

28. The method of claim 27, wherein the at least one second wire bond is configured to dissipate heat from the integrated device.

29. The method of claim 27, further comprising forming a metal layer over an outer surface of the encapsulation layer, wherein the metal layer is configured as an electromagnetic interference (EMI) shield.

30. The method of claim 29, wherein forming the metal layer comprises coupling the metal layer to the at least one second wire bond.

* * * * *